(12) United States Patent
Tung

(10) Patent No.: US 8,458,543 B2
(45) Date of Patent: Jun. 4, 2013

(54) SCAN BASED TEST ARCHITECTURE AND METHOD

(75) Inventor: Man Wai Tung, Puchong (MY)

(73) Assignee: Freescale Semiconductor, Inc., Austin, TX (US)

( * ) Notice: Subject to any disclaimer, the term of this patent is extended or adjusted under 35 U.S.C. 154(b) by 330 days.

(21) Appl. No.: 12/968,292

(22) Filed: Dec. 15, 2010

(65) Prior Publication Data

US 2011/0167310 A1 Jul. 7, 2011

(30) Foreign Application Priority Data

Jan. 7, 2010 (MY) .......................... PI 2010000044

(51) Int. Cl.
*G01R 31/28* (2006.01)

(52) U.S. Cl.
USPC ............................ 714/731; 714/726; 714/729

(58) Field of Classification Search
USPC ................................................. 714/731, 729
See application file for complete search history.

(56) References Cited

U.S. PATENT DOCUMENTS

| 6,405,335 | B1 * | 6/2002 | Whetsel ........................ 714/726 |
| 6,766,487 | B2 * | 7/2004 | Saxena et al. ................. 714/726 |
| 6,877,123 | B2 | 4/2005 | Johnston |
| 7,120,843 | B2 * | 10/2006 | Whetsel ........................ 714/726 |
| 7,444,568 | B2 | 10/2008 | Morrison |
| 7,555,688 | B2 | 6/2009 | Alvamani |
| 2009/0240996 | A1 * | 9/2009 | Sasaya et al. ................. 714/729 |
| 2009/0265596 | A1 * | 10/2009 | Chen et al. .................... 714/729 |

OTHER PUBLICATIONS

I. Hamzaoglu and J. Patel, "Reducing Test Application Time for Full Scan Embedded Cores", IEEE International Symposium on Fault Tolerant Computing (FTC'99), pp. 260-267, 1999.

* cited by examiner

*Primary Examiner* — Philip Guyton
(74) *Attorney, Agent, or Firm* — Charles Bergere

(57) ABSTRACT

An integrated circuit architecture including architecture for a scan based test, where the integrated circuit includes N scan chain sets including one or more scan chains and an input register bank. The input register bank includes an input for serially receiving an N-bit input vector synchronous with a first clock signal, and N-outputs configured to substantially simultaneously provide the N-bits of the received input vector as N separate output bits. The N separate output bits are used to provide test bits for simultaneously shifting into the respective inputs of the scan chain set synchronous with a second clock signal.

9 Claims, 11 Drawing Sheets

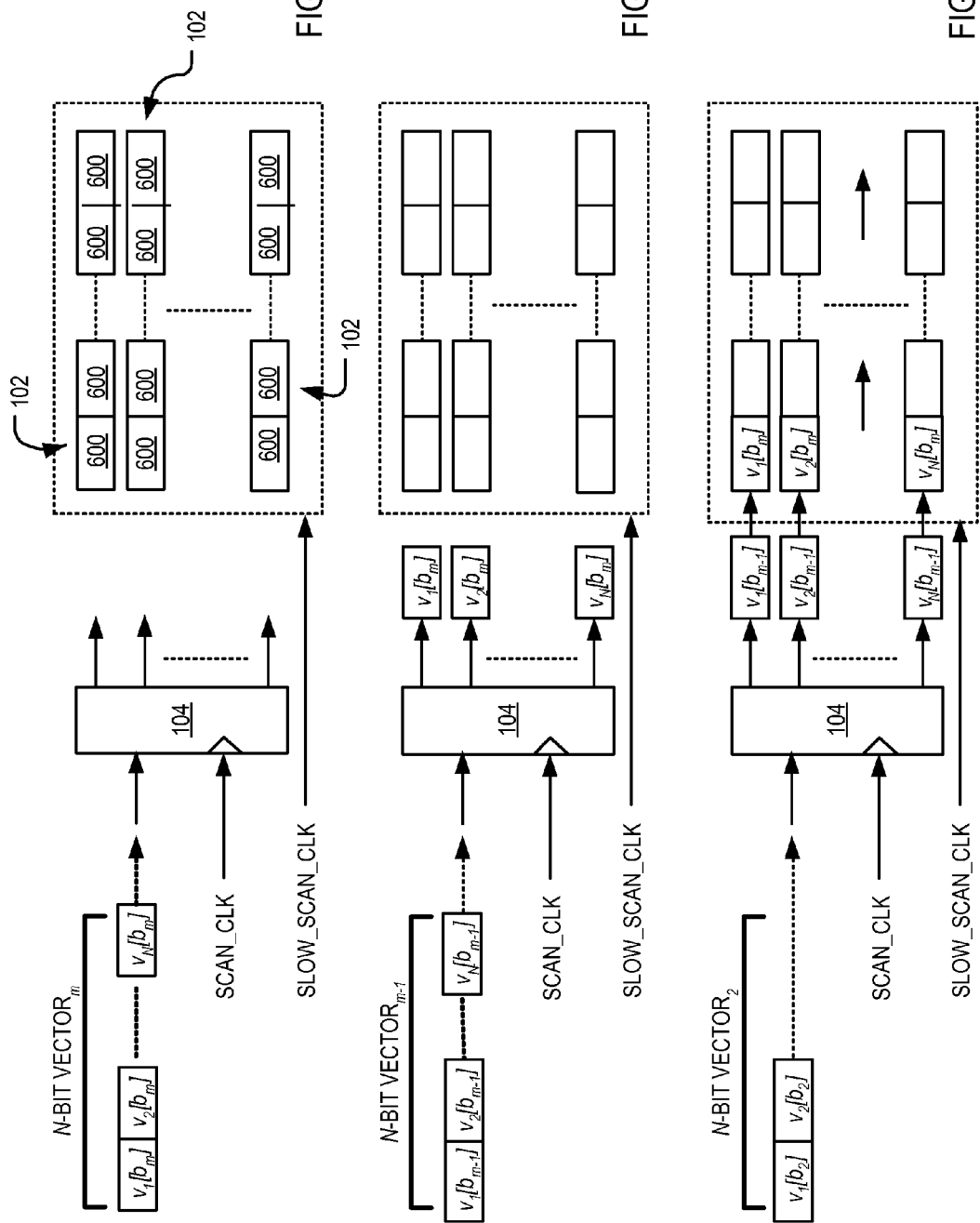

SCAN BASED TEST ARCHITECTURE AND METHOD

BACKGROUND OF THE INVENTION

The present invention relates generally to a method of testing integrated circuits using a scan-based test, and to an integrated circuit architecture for performing the scan-based testing method.

Integrated circuits designs often incorporate additional logic to support built-in test functions, such as scan-based testing. Such circuits are designed using a "designed-for-test" (DFT) approach which imposes additional design considerations over those which apply to functional design. Such additional considerations may include an assessment of different criteria, such as test performance (such as test coverage), the overhead of adding dedicated test logic, pin-count for test I/O, test application time, and test equipment requirements (for example, in terms of memory for test data and channels). Each criteria is typically evaluated in terms of its impact on fault detection capability, production time and cost of the integrated circuit. For example, reducing test performance may reduce the production time and cost, but may decrease the fault detection capability.

Usually an integrated circuit having an architecture which supports scan based testing is designed to operate in one of two modes, namely, a functional mode and a scan test mode. In functional mode, the various circuit elements of the integrated circuit are interconnected to perform the designed function or utility. On the other hand, in scan test mode the configuration of the circuit elements of the integrated circuits is modified so that memory cells, such as flip-flops, are coupled in a series arrangement as one or more sequences. Each separate series arrangement of memory cells is typically referred to as a "scan chain".

A typical scan test involves configuring the integrated circuit for scan test mode and "scanning-in" a scan or test vector (that is, a predetermined sequence of zeros and ones) into each scan chain. The test vector is typically generated using Automatic Test Pattern Generator (ATPG) tools. Typically, the number of bits in the test vector will correspond with the number of memory cells in the scan chain.

Having loaded the test vector, the integrated circuit is then configured to operate in functional mode for a predetermined number of clock cycles during which time the memory cells (and other circuit logic) operate on the loaded bits of the test vector. At the end of the predetermined number of clock cycles, each of the memory cells stores a result bit based on the results of the operation.

The integrated circuit is then reconfigured to scan test mode, and the stored result bits are unloaded (or "scanned-out") into a test analyzer, one bit at a time, from each scan chain synchronous with a clock. The complete sequence of result bits unloaded or output for a scan chain is typically referred to as a "scan-out". Each scan-out received by the test analyzer is compared with an expected scan-out for a respective test vector to determine whether there are faults in the integrated circuit.

As will be appreciated, as the complexity of integrated circuits increases, the length of the scan chains, and thus the length of the test vectors, also increases. Increasing the length of the test vectors increases the required amount of test data and thus the test storage required for that data. In addition, increasing the length of the test vectors also increases the test application time, which adversely impacts on production times, and thus production cost.

One attempt to reduce the length of the test vectors, and thus the test application time, involves increasing the number of scan chains (in other words, increasing the scan chain count). An example of such an approach is shown in FIG. 1. In the example shown in FIG. 1, different test vectors are loaded into each scan chain (SCAN CHAIN 0, . . . , SCAN CHAIN N) via a respective input (SCAN_IN_0, . . . , SCAN_IN_N) synchronous with a clock signal (SCAN_CLK) and under the control of the scan enable signal (SCAN_EN). After each test vector has been loaded into a respective scan chain the device under test (DUT) is configured to perform a functional operation. The resultant result vectors are then each unloaded via a respective output (SCAN_OUT_0, . . . , SCAN_OUT_N) synchronous with the clock signal.

Although the architecture illustrated in FIG. 1 may be effective at reducing test application time, the architecture does unfortunately require an increased pin count (as compared to a single scan chain implementation), since each scan chain requires a separate respective input and output pin. Thus, the number of scan chains which may be incorporated in the integrated circuit may be limited by the maximum pin-count of the integrated circuit device.

Several methods have been proposed to increase the scan chain count without unduly increasing the pin-count.

One conventional method involves grouping scan chains into "sets" comprising plural scan chains. Each set shares a common input pin and a common output pin and receives the same test vector. In some methods, the pin-count may be further reduced by compressing the test vector prior to scanning the test vector into a respective scan chain so as to thereby reduce the length of the data stream input into the device under test, and thus reduce the test data volume test and test data memory storage requirements. For example, the test vector may be compressed using a code-based compression scheme in which test codes contained in the test vector are compressed into code words, and an on-die built-in decoder module, such as a decoder circuit, decompresses the compressed test vector to recover the test codes.

Hamazaoglu et al. (1999) outlines an architecture, referred to as the Illonois Scan Architecture (ISA), which attempts to reduce test data volume and test application time by dividing a scan chain into multiple segments. FIG. 2 depicts an example of an conventional ISA architecture which includes scan chain sets (SET 'A', . . . , SET 'N'). Each scan chain in a set receives a test vector derived from a test input received at a respective scan input (SCAN_IN_0, . . . , SCAN_IN_N). In this example, each test input is a data stream which has been compressed using a suitable coding scheme, and which is decompressed by decompression logic to provide the test vector to the respective scan chain set.

The architecture illustrated in FIG. 2 decreases the number of test vectors required to maintain similar scan coverage to a standard linear scan of the type described above. However, although this architecture may reduce the test application time and pin count as compared to a standard linear scan (and particularly when compared to a full linear scan), the resultant pin-count, and thus the required ATPG tester channels, is still nevertheless dependent upon the number of scan chain sets. Moreover, scan compression involving a single scan input/output pair requires highly complex compression and decompression circuitry, resulting in packages with questionable test coverage.

There is a need for an improved scan architecture and method which reduces the volume of test data and minimizes pin-count, whilst maintaining effective test coverage.

BRIEF DESCRIPTION OF THE DRAWINGS

The present invention will now be described in relation to preferred embodiments as illustrated in the accompanying drawings. However, it is to be understood that the following description is not to limit the generality of the above description.

FIGS. 6A to 6F show a sequence depicting loading plural test vectors $v_1, v_2, v_3, \ldots, v_N$ for a scan based test into a test circuit of an integrated circuit in accordance with an embodiment of the present invention;

DETAILED DESCRIPTION OF AN EMBODIMENT

Figure 1:
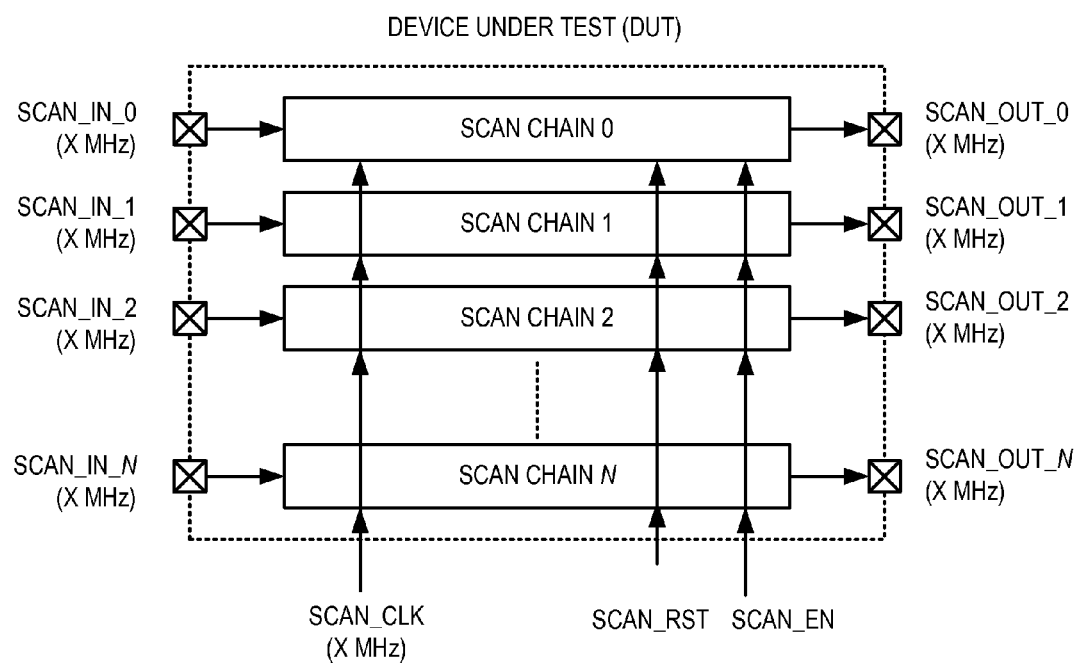
FIG. 1 shows a block diagram of a conventional scan-based test architecture for an integrated circuit.
Figure 2:
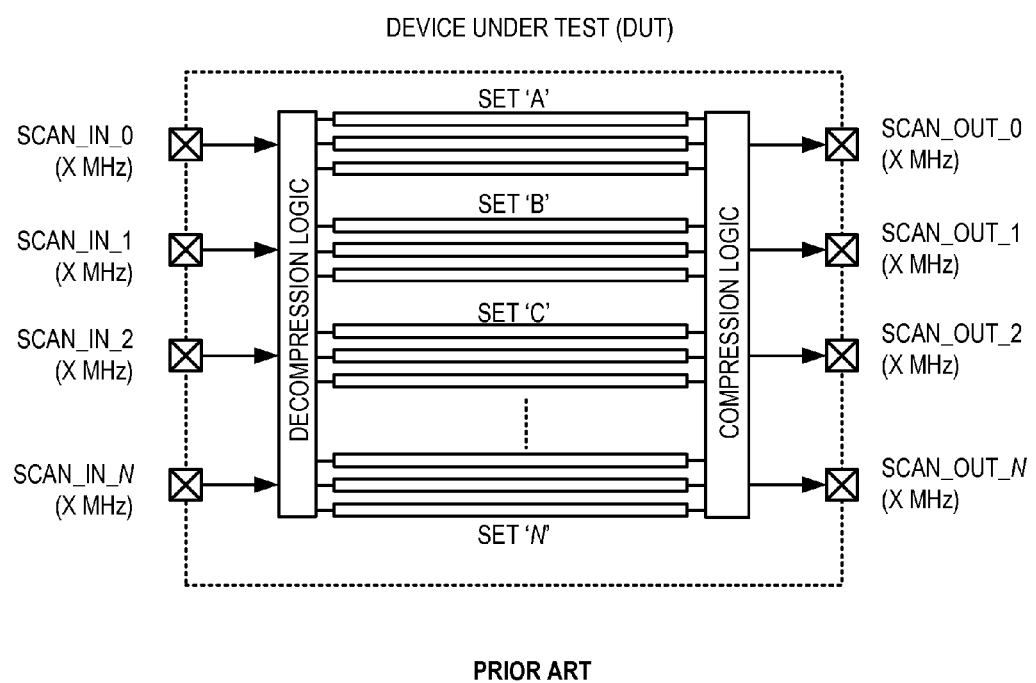
FIG. 2 shows a block diagram of another conventional scan-based test architecture for an integrated circuit.

The terms "assert" or "set" and "negate" (or "de-assert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal described herein may be designed as positive or negative logic, where negative logic can be indicated by a bar over the signal name or an asterix (*) following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

An integrated circuit in accordance with an embodiment of the invention includes input logic for receiving an input vector comprising plural bits, each bit for shifting a respective test bit into one of plural scan chain sets, and de-serializing the input vector to provide the respective test bits for input into each respective scan chain set.

The present invention also provides an integrated circuit, comprising a plurality of scan chain sets N including one or more scan chains; and an input register bank including an input for serially receiving an N-bit input vector synchronous with a first clock signal, and N-outputs configured to substantially simultaneously provide the N-bits of the received input vector as N separate output bits, each output bit for providing a respective test bit for shifting into an input of a respective scan chain set synchronous with a second clock signal.

Each scan chain or scan chain set may include an output for providing synchronous with the second clock signal a serial output including result bits generated by a test function operating on the respective test bits after each scan chain set has been loaded with a test vector comprising plural test bits.

The integrated circuit may further include an output register bank including N inputs, each input for serially receiving the result bits synchronous with the second clock signal. The output register bank may be configured to serially output synchronous with the first clock signal an N-bit output vector comprising corresponding result bits for each scan chain set. The serial output may be provided at an output of the integrated circuit.

In an embodiment in which each scan chain set includes plural scan chains, the integrated circuit may further include decompression logic disposed between the outputs of the input register bank and the inputs of the scan chains of a scan chain set. The decompression logic may receive and decompress each output bit of the input register bank into one or more test bits for shifting into a respective scan chain. Such an embodiment may also include compression logic for receiving the result bits for each scan chain of a scan chain and compressing the result bits for each scan chain into a single result bit for the scan chain set.

In one embodiment, which includes decompression logic, the N-bit input vector may include code values encoding the respective test bits for shifting into the plural scan chain sets, and thus provide a compressed input vector. As will be appreciated by those of skill in the art, the function of the decompression logic is to decompress a compressed N-bit input to provide the respective test bits for shifting into the plural scan chain sets. Hence, in one embodiment the outputs of the input register bank are coupled to inputs of the decompression logic. The compressed input vector may be provided, for example, by an automatic test equipment unit in communication with the integrated circuit.

On the other hand, the compression logic compresses the separate result bits output from the scan chains of each scan chain set prior to output of the N-bit output vector from the output register bank. In other words, in an embodiment, the output register bank includes compression logic for providing the N-bit output vector as a compressed output including coded values attributable to the separate result bits. The compressed output vector may be provided, for example, to an automatic test equipment unit in communication with the output of the integrated circuit.

Each scan chain may consist of, for example, between 100 to 1000 scannable elements. The number of scan chain sets, and the number of scan chains within each set, may vary according to the number of scannable elements (such as, flip-flops) in the integrated circuit, the selected base compression/decompression scheme, and a desired length of each scan vector.

The integrated circuit may include a clock means, such as a clock generator, for deriving the second clock signal from the first clock signal such that the second clock signal has a signal frequency $F_2 = F_1/N$, where $F_1$ is the frequency of the first clock signal. The frequency of the first clock signal may be between, for example, 25 MHz to 500 MHz, with the actual frequency depending on the capability of the I/O pads of the integrated circuit, and the timing design for shifting input and output bits across the input and output register banks respectively.

The clock means may include, for example, a frequency divider which is receives the first clock signal as a clock input and provides the second clock signal as an output. A suitable frequency divider may comprise one or more edge triggered flip-flops, such as a D-type flip flop.

In an embodiment, the input register bank comprises an N cell shift register capable of storing the N-bit input vector. Preferably, the shift register is configured as a serial-in parallel out (SIPO) configuration. Each cell may comprise an edge triggered flip-flop, such as a D-type edge triggered flip flop.

In an embodiment, the output register bank comprises an N cell shift register for storing the N-bit output vector. Preferably, the shift register is configured as a serial-in parallel out (SIPO) configuration. Each cell may comprise an edge triggered flip-flop, such as a D-type edge triggered flip flop.

The present invention also provides a method of loading plural scan chain test vectors $v_1, v_2, v_3, \ldots, v_N$ for a scan based test into a test circuit of an integrated circuit, where the test circuit comprising plural N scan chain sets. The method includes forming the scan chain test vectors $v_1, v_2, v_3, \ldots, v_N$, each scan chain test vector for testing a respective scan chain set and comprising plural test bits $b_1, b_2, b_3, \ldots, b_m$; assembling corresponding test bits $b_i$ of each test vector $v_1, v_2, v_3, \ldots, v_n$, into plural N-bit input vectors $a_i$ such than $a_i=v_1[b_i], v_2[b_i], v_3[b_i], \ldots, v_N[b_i]$, where i=1 to m; and synchronous with a first clock signal, consecutively serially inputting each N-bit input vector $a_i$ into an N-bit input register bank of the integrated circuit and shifting synchronous with a second clock signal each test bit of each input vector $a_i$ substantially simultaneously into a respective scan chain set.

Also provided is a method of obtaining plural result vectors $r_1, r_2, r_3, \ldots, r_N$ for a scan based test from an integrated circuit storing each result vector in a respective scan chain set of a test circuit comprising N scan chain sets, each result vector comprising result bits $b_1, b_2, b_3, \ldots, b_m$, the method comprising synchronous with a first clock signal, substantially simultaneously receiving a separate corresponding result bit $b_r$ from each scan chain set, each result bit being a bit from a respective result vector $r_1, r_2, r_3, \ldots, r_N$ where r=1 to m; synchronous with a second clock signal, serially outputting an N-bit vector from an output of the integrated circuit, the N-bit vector including corresponding result bits $b_i$ for each result vector; and processing plural consecutive output N-bit vectors to assemble corresponding result bits $b_i$ of each N-bit vector into the result vectors $r_1, r_2, r_3, \ldots, r_N$.

Also provided is a method of testing an integrated circuit including a test circuit, the test circuit comprising N scan chain sets, the method comprising serially inputting plural input vectors into an input of the integrated circuit during m input cycles of a first clock; after each input cycle, substantially simultaneously causing a test bit to be shifted into each scan chain set, each test bit being attributable to a respective bit of the input vector for the cycle; after input of m input vectors, enabling a test of the test circuit, said test causing each scan chain of a scan chain set to be loaded with a respective result vector, each result vector comprising plural result bits; substantially simultaneously shifting each result bit out of the test circuit during m output cycles, each output cycle causing an output register of the integrated circuit to be loaded with an N-bit vector comprising plural bits, each being attributable to a respective result bit; and after each output cycle, serially outputting an N-bit vector from an output of the integrated circuit, the N-bit vector including corresponding result bits $b_i$ for each result vector.

The present invention also provides a method of testing an integrated circuit including a test circuit, the test circuit comprising plural (N) scan chain sets, the method comprising: loading each scan chain set with a respective test vector $v_1, v_2, v_3, \ldots, v_N$, each test vector for testing a respective scan chain set and comprising plural test bits $b_1, b_2, b_3, \ldots, b_m$, said loading comprising: synchronous with each cycle of N cycles of a first clock signal, serially inputting plural (m) N-bit input vectors $a_i$ into an input of the integrated circuit, each input vector comprising corresponding bits $b_i$ of each test vector such than $a_i=v_1(b_i), v_2(b_i), v_3(b_i), \ldots, v_N(b_i)$, where i=to m; following each input of an N-bit vector, substantially simultaneously shifting each test bit into the respective scan chain set synchronous with a second clock signal; enabling a test of the test circuit, said test loading each scan chain set with plural result bits $b_r$, where r=1 to m; synchronous with the second clock signal, substantially simultaneously receiving a separate corresponding result bit $b_r$ from each scan chain set, each result bit being a bit from a respective result vector $r_1, r_2, r_3, \ldots, r_N$; and synchronous with the first clock signal, serially outputting an N-bit vector from an output of the integrated circuit, the N-bit vector including corresponding result bits $b_i$ for each result vector; and processing plural consecutive output N-bit vectors to assemble corresponding result bits $b_i$ of each N-bit vector into the result vectors $r_1, r_2, r_3, \ldots, r_N$.

Embodiments of the present invention are expected to reduce the pin count of input and output pins dedicated to testing functions whilst maintaining effective test coverage.

Figure 3:
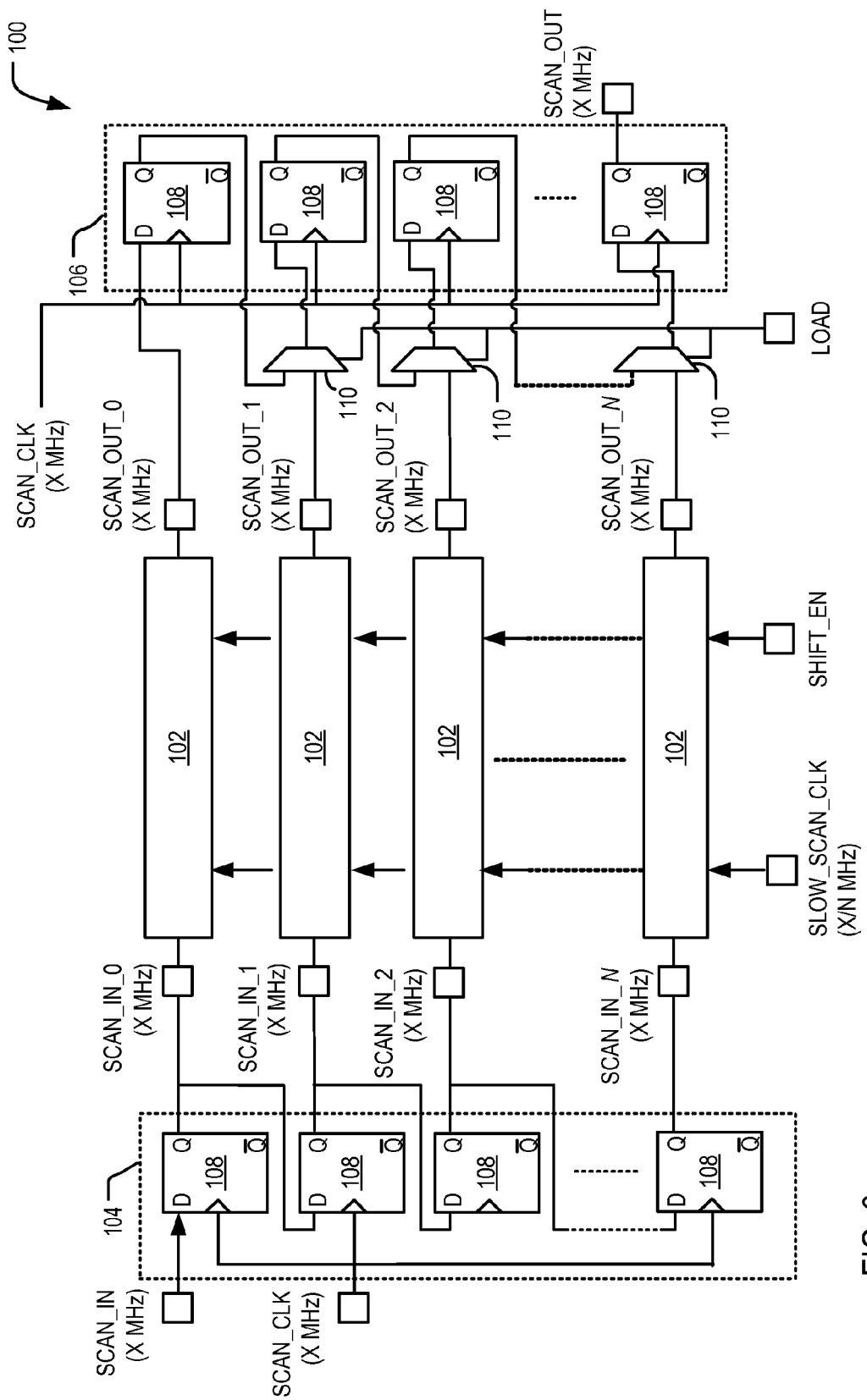
FIG. 3 shows a block diagram of a scan based test architecture for an integrated circuit in accordance with an embodiment of the present invention.

Referring now to FIG. 3, a block diagram of a scan based test architecture 100 for an integrated circuit in accordance with an embodiment of the present invention is shown. The architecture 100 includes a plurality of scan chain sets 102, an input register bank 104, and an output register bank 106.

Each scan chain set 102 comprises a series arrangement of plural memory elements (not shown), such as flip-flops, of the integrated circuit. In the embodiment illustrated, the series arrangement of the memory elements depends on, and is thus controlled by an enable signal (SHIFT_EN). In the embodiment illustrated in FIG. 3, each scan chain set 102 includes a single scan chain 102 of a conventional configuration. However, as will be explained in more detail following, it is possible that other embodiments may include scan chain sets 102 which include plural scan chains. In either case, the techniques and considerations for configuring the scan chain sets 102 would be well known to a skilled addressee.

The input register bank 104 and the output register bank 106 each include plural register cells 108, which are shown as D-type flip-flops. However, it will of course be appreciated that other types of register cells 108 may be used, such as JK Flip Flops.

The register cells 108 of the input register bank 104 serially receive plural N-bit input vectors bitwise via an input (SCAN_IN) to the input register bank 104 synchronous with a first clock signal (SCAN_CLK). For each N-bit input vector, and once all of the bits of that vector have been received, the input register bank 104 then provides each of the N-bits of the N-bit input vector at a respective output (Q) of each register cell 108. In other words, the first clock signal (SCAN_CLK) triggers the input register bank 104 to serially shift each N-bit input vector (SCAN_IN) into the input register bank 104 one vector after the other. For each N-bit input vector, the shifting of each of the N-bits of that input vector continues, synchronous with the first clock signal (SCAN_CLK) until each bit of the N-bit input vector (SCAN_IN) appears at a respective output of the input register bank 104, thus providing the serially input N-bit input vector (SCAN_IN) as a parallel output for shifting a test bit into a respective scan chain 102 via a respective input (SCAN_IN_0, . . . SCAN_IN_N).

In the embodiment illustrated in FIG. 3, each N-bit input vector comprises individual bits $b_i$ of different test vectors $[v_1, v_2, v_3, \ldots, v_N]$ that are serially input to the DUT; that is, one particular bit for each test vector to be input into a scan chain set. Each test vector comprises bits $[b_1, b_2, b_3, \ldots b_{m-1}, b_m]$, where m is the length of the scan chain sets 102. Of course, for different embodiments the length of the scan chains 102 may vary and thus the number of bits in the N-bit input vector may similarly vary. For example, the scan chain length may vary between 100 to 1000 memory elements.

For the remainder of the description, and for convenience, the set of N-bit input vectors separately input via "SCAN_IN" in an architecture 100 according to the first embodiment will herein be represented using the notation $[a_1, a_2, a_3 \ldots, a_m]$ and each N-bit input vector represented using the notation:

$a_i = v_1[b_i], v_2[b_i], v_3[b_i], \ldots, v_N[b_i]$ where i=1 to m.

Thus, and by way of example, a first input vector $a_1$ may comprise all of the first bits (that is, $b_1$) of each test vector $[v_1, v_2, v_3, \ldots, v_N]$, whereas input vector $a_m$ may comprise the terminal bits (that is, $b_m$) of each test vector $[v_1, v_2, v_3, \ldots, v_N]$.

Each test vector $[v_1, v_2, v_3, \ldots, v_N]$ may be specified using conventional test pattern generation methods such as those which employ automatic test equipment (ATE), ATPG tools, or the like. Suitable methods would be well understood by a skilled person.

Following input of an N-bit input vector $a_i$ into the input register bank 104, and thus once each bit of the N-bit input vector $a_i$ is available at a respective output (Q) of a register cell 108 of the input register bank 104, a second clock signal (SLOW_SCAN_CLK) causes each bit of the N-bit input vector $a_i$ to be substantially simultaneously shifted into a respective scan chain set 102 via the respective scan chain input (SCAN_IN_0, . . . SCAN_IN_N).

In the embodiment illustrated in FIG. 3, it is important to note that although the bit (hereinafter the "test bit") shifted into a scan chain 102 is a bit from the N-bit input vector $a_i$, it is possible that other embodiments may shift into each scan chain 102 a test bit which is attributable to a respective bit or bits of the N-bit input vector $a_i$, but is not necessarily the same bit or bits. In other words, a bit from the N-bit input vector $a_i$ may cause a test bit to be shifted into a respective scan chain 102. For example, in some embodiments the input register bank 104 may include, or be in communication with, decompression logic which derives the test bits for shifting into a respective scan chain 102 by decompressing an N-bit input vector(s) comprising coded values encoding test bits for shifting shifted into a respective scan chain 10. Such a compressed input vector may be provided, for example, by suitably programmed automatic test equipment (ATE).

After each scan chain set has been loaded with a complete test vector, a functional test operation is then performed on the input test vector which causes each scan chain set 102 to store the result bits from that test.

After the functional test operation, a control signal (LOAD) then controls multiplexers 110 to either configure the output register bank 106 to receive result bits for a respective scan chain set 102 synchronous with a second clock signal (SCAN_CLK), or to serially output synchronous with the first clock signal (SLOW_SCAN_CLK), an N-bit output vector comprising corresponding result bits received for each scan chain 102.

Figure 4:
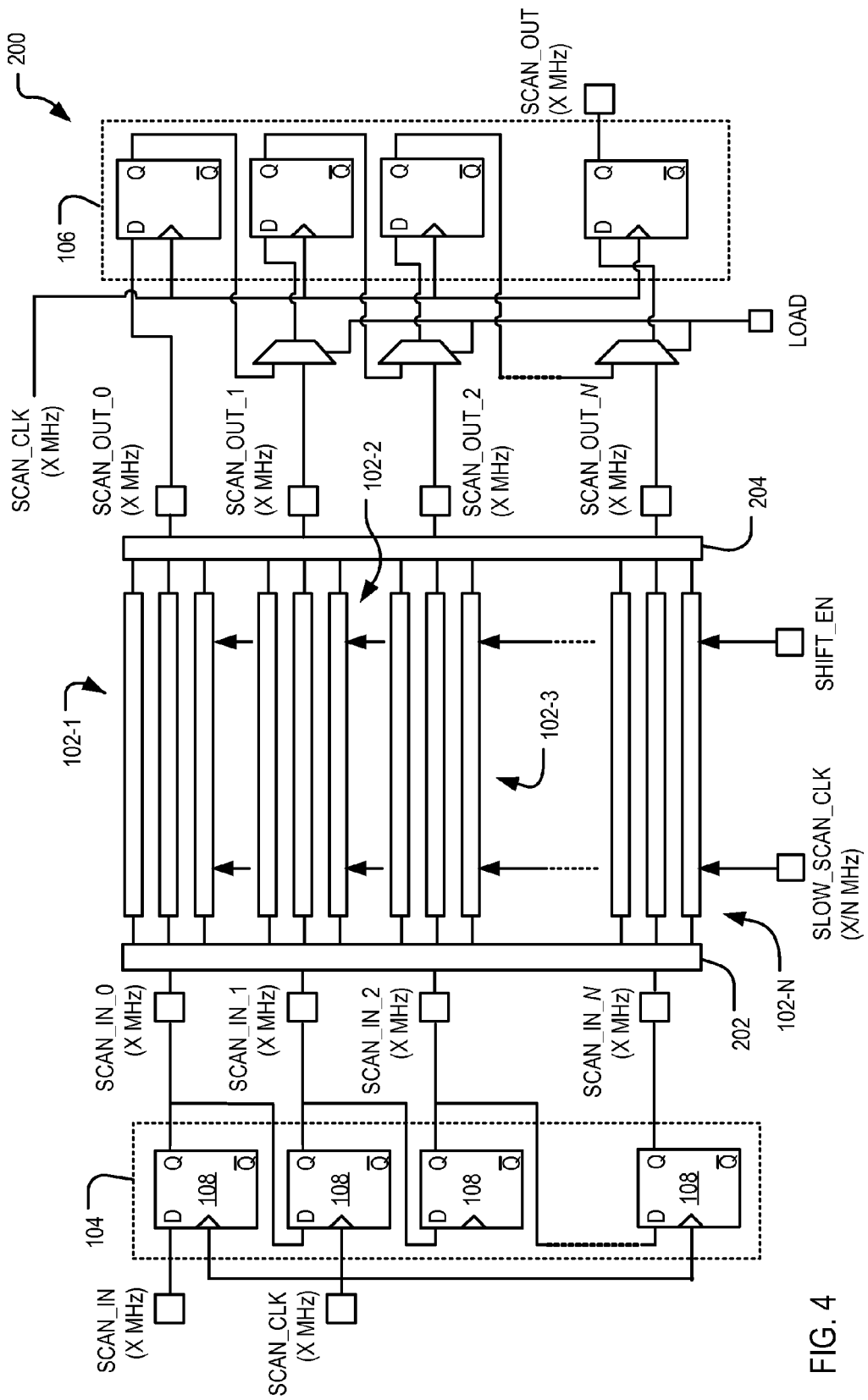
FIG. 4 shows a block diagram of a scan based test architecture in accordance with a second embodiment of the present invention.
Figure 5A:
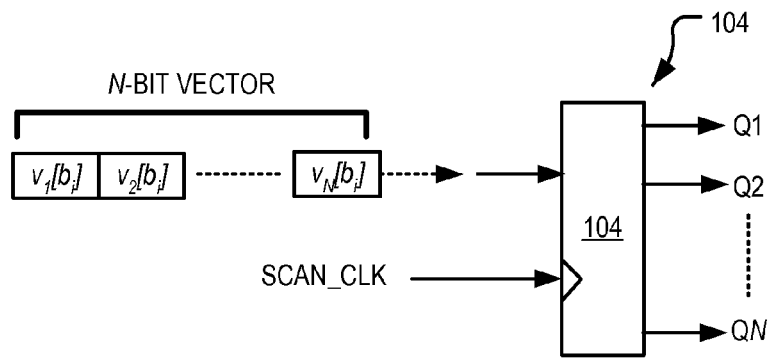
FIGS. 5A to 5D show a sequence depicting loading an input vector for a scan based test into a test circuit of an integrated circuit in accordance with an embodiment of the present invention.
Figure 5B:
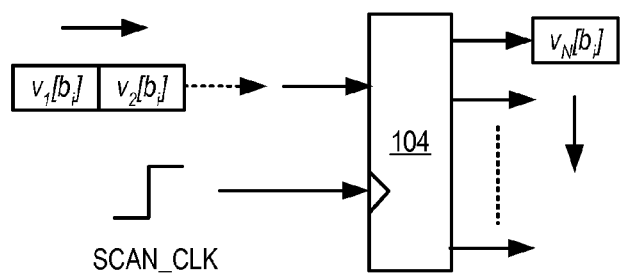
Figure 5C:
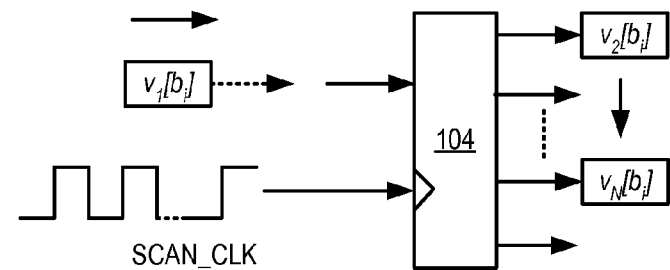
Figure 5D:
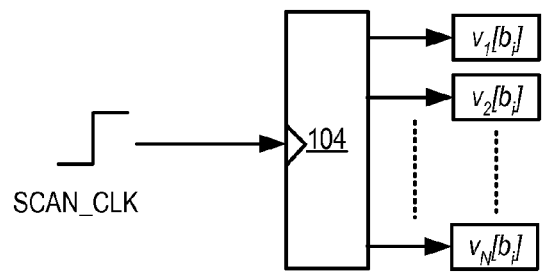

FIG. 4 shows a block diagram for another embodiment of an integrated circuit according to the present invention. In the embodiment illustrated in FIG. 4 each scan chain set 102-1, 102-2, 102-3, . . . , 102-N includes plural scan chains. Indeed, in the present example each scan chain set 102-1, 102-2, 102-3, . . . , 102-N includes three scan chains. Of course, it will be appreciated that it is possible that other embodiments may include scan chain sets 102-1, 102-2, 102-3, . . . , 102-N which include more or less scan chains.

The integrated circuit 200 illustrated in FIG. 4 includes decompression logic 202 for performing a decompression operation involving the N separate output bits from the input register bank 104 to thereby provide the test bits for simultaneous shifting into a respective scan chain of a scan chain set 102-1, 102-2, 102-3, . . . , 102-N synchronous with the second clock signal (SLOW_SCAN_CLK). Thus in this embodiment, the test bit shifted into a respective scan chain of a scan chain set 102-1, 102-2, 102-3, . . . , 102-N is attributable to a respective code value obtained from an N-bit input vector, or consecutive N-bit input vectors, as opposed to being a bit of the N-bit input vector. Suitable decompression logic would be known to a skilled addressee.

The integrated circuit 200 illustrated in FIG. 4 also includes compression logic 204 for receiving separate result bits from the respective scan chains of a scan chain set 102-1, 102-2, 102-3, . . . , 102-N, and providing to the output register bank 106 a separate result bit for each scan chain set 102-1, 102-2, 102-3, . . . , 102-N. In other words, the compression logic 204 provides a result bit for each scan chain set which is attributable to the result bits received from the respective scan chains of that set. Suitable compression logic would be well known to a skilled addressee.

Aside from the inclusion of the decompression logic 202 and the compression logic 204 the operation of the integrated circuit 200 is substantially similar to the integrated circuit 100 described with reference to FIG. 3.

FIGS. 5A to 5D show a sequence depicting an example of loading an N-bit input vector for a scan based test into an input register bank 104 of an integrated circuit in accordance with an embodiment including scan chains 102 (ref. FIG. 3) having m memory elements. In this example, the input register bank 104 is shown as a single functional block merely for convenience and the outputs of the input register bank 104 are designated Q1, Q2, . . . QN. The N-bit input vector is represented using the notation:

N-bit input vector=$v_1[b_i], v_2[b_i], v_3[b_i], \ldots, v_N[b_i]$ where i=1 to m and wherein each bit $b_i$ is for providing a test bit of a respective test vector for shifting into a respective one of the scan chain sets synchronous with the clock signal SCAN_CLK via are a respective output Q1, Q2, . . . QN.

The input register bank 104 is as a negative edge triggered bank. As is shown in FIGS. 5A-5D, on each negative (or falling) edge of SCAN_CLK a bit of the N-bit input vector is shifted into the input register bank 104. It will of course be appreciated that a negative (or falling) edge triggered bank may be used. Thus, in the arrangement shown in FIGS. 5A to 5D, all of the bits of the N-bit input vector are shifted into the input register bank 104 after N cycles (in other words N rising edges) of SCAN_CLK. In the sequence depicted $v_N[b_i]$ is shifted into the input register bank 104 on the first cycle of SCAN_CLK and continues to be shifted "along" the register cells 108 (ref. FIG. 3), and thus from Q1 to QN, until $v_1[b_i]$ is shifted into the input register bank 104 on the $N^{th}$ cycle of SCAN_CLK.

Figure 6D:
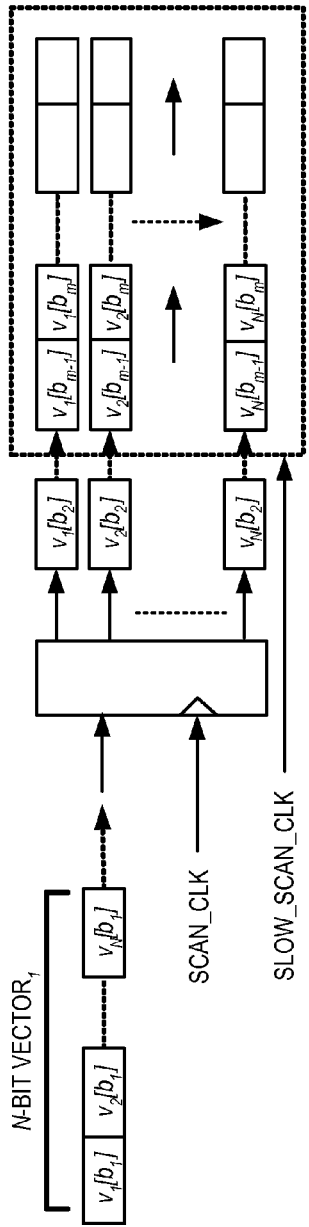
Figure 6E:
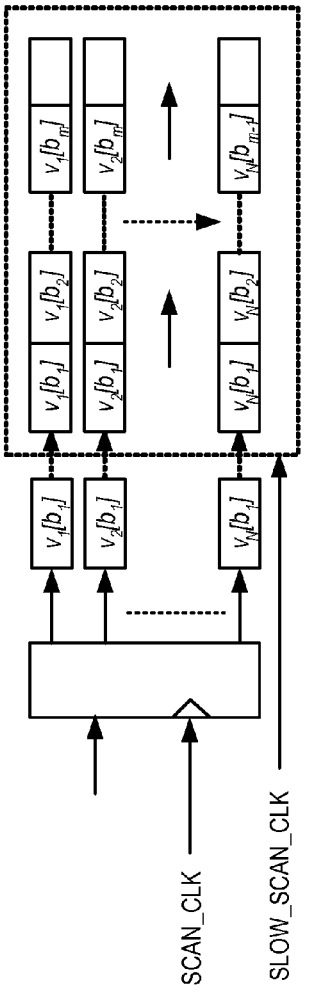
Figure 6F:
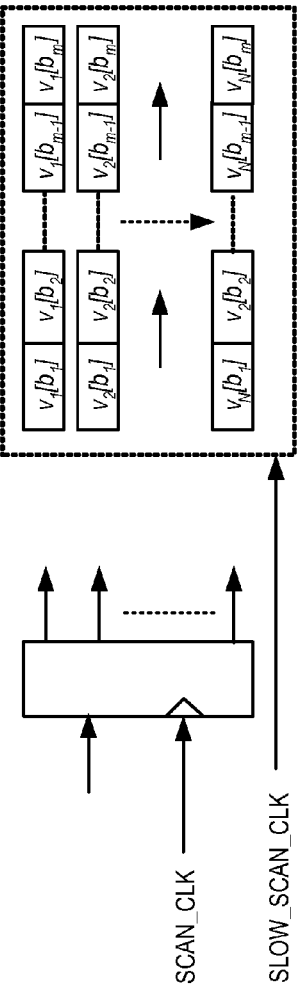

Turning now to FIGS. 6A to 6F, there is shown a sequence depicting an example of loading plural test vectors $v_1$, $v_2, \ldots, v_N$ into the scan chain groups 102-1, 102-2, ..., 102-N of an integrated circuit in accordance with an embodiment. In the depicted example each test vector comprises test bits $b_1$, $b_2, b_3, \ldots, b_{m-1}, b_m$ obtained from plural input N-bit vectors which, in this example, comprise vectors $\text{VECTOR}_1$ (ref. FIG. 6D) to $\text{VECTOR}_m$ (ref. FIG. 6A). $\text{VECTOR}_1$ to $\text{VECTOR}_m$ are each serially input into the input register 104 using a process similar which is similar to that described above in relation to FIGS. 5A to 5D. Functional blocks for memory cells 600 of the scan chain sets 102-1, 102-2, ..., 102-N have been depicted for ease of explanation.

Each N-bit vector input vector $\text{VECTOR}_1, \ldots, \text{VECTOR}_m$ is serially and consecutively received by the input register bank 104 synchronous with SCAN_CLK.

Following input of the bits of an N-bit input vector into the input register bank 104, plural test bit are substantially simultaneously shifted into each scan chain set 102-2, ..., 102-N synchronous with SLOW_SCAN_CLK.

In the embodiment illustrated each test bit corresponds to a respective bit of a corresponding N-bit input vector. For example, each of the first test bits $b_1$ of each test vector corresponds with a respective bit of the N-bit input vector $\text{VECTOR}_1$. Similarly, each of the final test bits $b_m$ of each test vector correspond to a respective bit of the N-bit input vector $\text{VECTOR}_m$.

On the next cycle of the SLOW_SCAN_CLK, and following receipt of the bits of the n N-bit input vector into the input register bank 104, additional plural test bits are substantially simultaneously shifted into each scan chain set 102-2, ..., 102-N. This shifting process continues until all test bits have been shifted into their respective scan chain sets 102-2, ..., 102-N.

FIGS. 6A to 6F show an example of m consecutive cycles of SLOW_SCAN_CLK which results in bits $b_1, b_2, b_3, \ldots, b_{m-1}, b_m$ of test vectors $v_1, v_2, \ldots, v_N$ being serially shifted into the respective scan chain groups 102-1, 102-2, ..., 102-N.

Figure 6G:
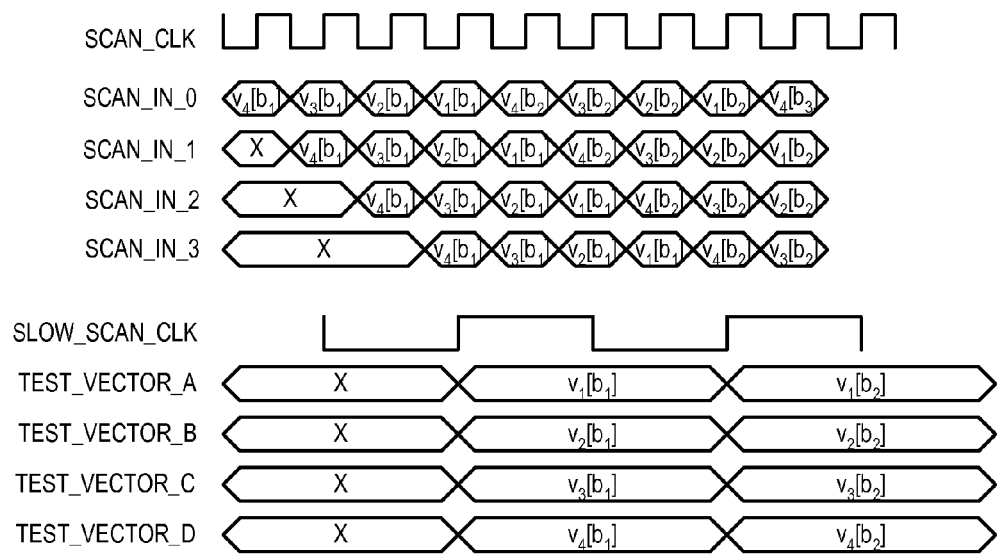
FIG. 6G shows an example timing diagram for an embodiment of the present invention.

FIG. 6G shows a timing diagram for an example which involves loading an embodiment which includes four scan chain sets 102 with respective test vectors TEST_VECTOR_A, TEST_VECTOR_B, TEST_VECTOR_C, and TEST_VECTOR_D via the respective scan chain set inputs SCAN_IN_0, SCAN_IN_1, SCAN_IN_2, and SCAN_IN_3.

As shown in the drawing, each individual bit of an input vector is associated with a different scan chain set (e.g., from the timing diagram for the first serially input input vector comprising bits D3a, D2a, D1a, D0a->D0a of the input vector is scanned into scancell0, D1a is scanned into scancell1, etc.), even though the timing diagram is for a circuit that includes a decompressor. With the decompressor, the shift registers will first de-serialize the vectors input to the decompressor. Scan cell0 will then receive the vector from the decompressor. Thus, even when a decompressor is provided, each individual bit of an input vector is associated with a different scan chain set.

As previously explained, after each of the input of m N-bit input vectors, which in this example together contain all of the bits for all of the test vectors, the scan chain set (in other words, the test circuit) comprising the scan chain 102-1, 102-2, ..., 102-N is configured to conduct a functional test by disabling the SHIFT_EN signal (see FIGS. 3 and 4) for a predetermined number of clock cycles.

During the functional test the memory element of the scan chain sets 102-1, 102-2, ..., 102-N operate on the test bits loaded during loading of the test vectors to provide a respective result bit. Thus, after the completion of the functional test, at which time SHIFT_EN signal is enabled, each scan chain of a scan chain set 102-1, 102-2, ..., 102-N is loaded with a respective result vector comprising the results bits for each memory element in the respective scan chain.

Figure 7A:
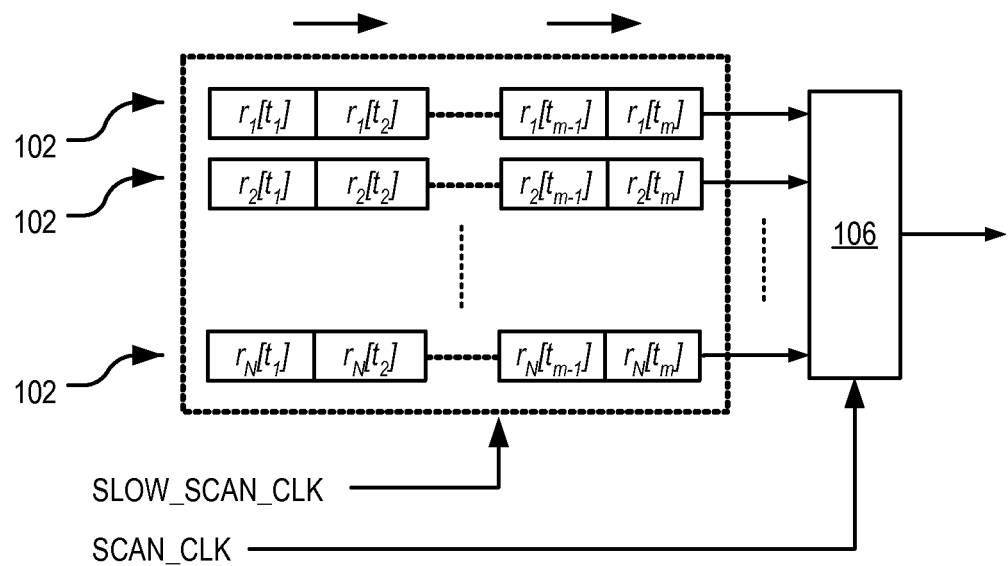
FIGS. 7A to 7C show a sequence depicting unloading plural output vectors for a scan based test from the test circuit of an integrated circuit in accordance with an embodiment.
Figure 7B:
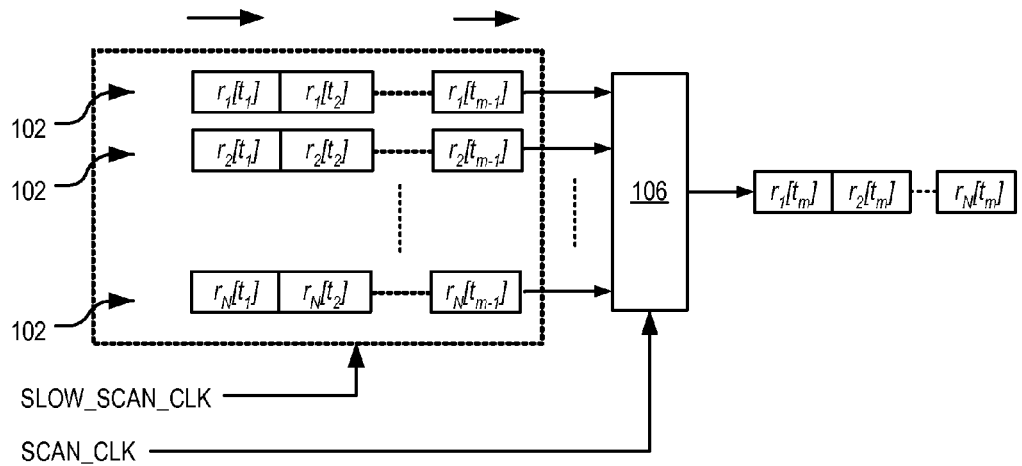
Figure 7C:
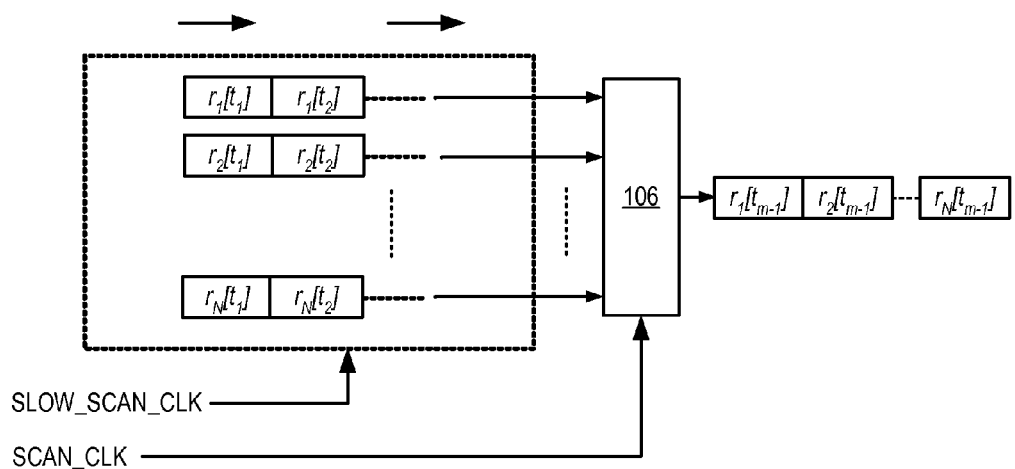

FIGS. 7A to 7C illustrate an example of unloading, or "shifting out", of the result vectors $r_1, r_2, r_3, r_N$ from the scan chains 102-1, 102-2, ..., 102-N into the output register bank 106 during m cycles of SLOW_SCAN_CLK. In FIG. 7A to FIG. 7C each result vector may be represented as $r_i=[t_1, t_2, t_3, \ldots, t_{m-1}, t_m]$ where i=1 to m.

Each cycle of SLOW_SCAN_CLK loads the output register 106 with correspondingly positioned bits of each of the result vectors $r_1, r_2, r_3, r_N$. For example, the first cycle of SLOW_SCAN_CLK loads the output register 106 with the bits $t_m$ of each result vector $r_1, r_2, r_3, r_N$ whereas the $m^{th}$ cycle of SLOW_SCAN_CLK loads the output register 106 with the bits $t_1$ of each result vector $r_2, r_3, r_N$. Hence, each cycle of SLOW_SCAN_CLK loads the output register 106 with N-bits.

Following each cycle of SLOW_SCAN_CLK, the N-bits loaded into the output register 106 are shifted out of the output register 106 during N cycles of the SCAN_CLK by serially outputting an N-bit vector from an output of the integrated circuit. Each N-bit vector includes corresponding result bits $b_i$ for each result vector $r_1, r_2, r_3, r_N$. The process of loading and unloading the output register 106 with the corresponding result bits $b_i$ of each result vector $r_1, r_2, r_3, r_N$ continues until m N-bit vectors have been output by the output register 106 and thus all of the result bits for each result vector have been output from the scan chain sets 102-1, 102-1, 102-N.

Figure 8:
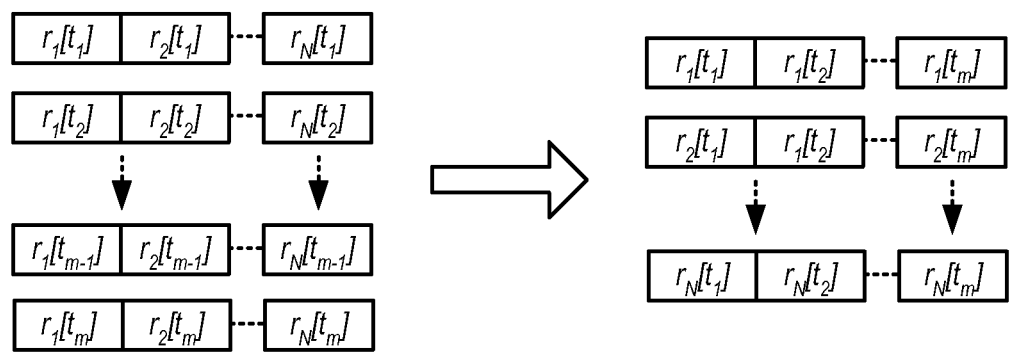
FIG. 8 shows an example of forming plural result vectors from plural output vectors for a scan based test from the test circuit of an integrated circuit in accordance with an embodiment.

In the present case, each of the N-bit vectors is communicated to a test analyzer which processes consecutive output N-bit vectors to assemble corresponding result bits $t_i$ of each N-bit vector into the result vectors $r_1, r_2, r_3, \ldots, r_N$. As shown in FIG. 8, the test analyzer then compares each vectors result vector $r_1, r_2, r_3, \ldots, r_N$ with a vector indicating an expected test result to determine whether the integrated circuit contains faults.

Suitable test analysers will be apparent to persons skilled in the relevant art. Finally, it is to be understood that various alterations, modifications and/or additions may be introduced into the constructions and arrangements of parts previously described without departing from the scope of the invention.

The invention claimed is:

1. An integrated circuit, comprising:
   a plurality of scan chain sets N including one or more scan chains;
   an input register bank including an input for serially receiving an N-bit input vector synchronous with a first clock signal, and N-outputs configured to substantially simultaneously provide the N-bits of the received input vector as N separate output bits, each output bit for providing a respective test bit for shifting into an input of a respective scan chain set synchronous with a second clock signal; and
   means for deriving the second clock signal from the first clock signal, wherein the second clock signal has a signal frequency $F_2=F_1/N$, where $F_1$ is the frequency of the first clock signal.

2. The integrated circuit of claim 1, further including means for enabling a test operation after each scan chain N has received a complete test vector comprising plural test bits, said test operation loading each scan chain set with plural result bits;
   and an output register bank including N inputs, each input for serially receiving result bits for a respective scan chain set synchronous with the second clock signal, wherein the output register bank is configured to serially output synchronous with the first clock signal, an N-bit output vector comprising corresponding result bits for each scan chain set at an output of the integrated circuit.

3. The integrated circuit of claim 2, further including compression logic coupled to the output register bank, the compression logic for receiving an output bit from each scan chain of a scan chain set and compressing the output bits to provide the result bits for shifting into the output register bank synchronous with the second clock signal.

4. The integrated circuit of claim 1, further comprising additional logic for deriving from the first clock signal a load signal for enabling the output register bank to substantially simultaneously receive the separate result bits for the respective scan chains set synchronous with the second clock signal.

5. The integrated circuit of claim 1, wherein the input register bank comprises N shift registers, each shift register receiving the first clock signal as a clock input.

6. The integrated circuit of claim 1, further including decompression logic coupled to the input register bank, the decompression logic for receiving the N separate output bits and decompressing received N separate output bits to obtain the test bits for shifting into respective scan chains set synchronous with the second clock signal.

7. A method of loading plural test vectors $v_1, v_2, v_3, \ldots, v_N$ for a scan based test into a test circuit of an integrated circuit, wherein the test circuit comprises N plural scan chain sets, the method comprising:
   forming the test vectors $v_1, v_2, v_3, \ldots, v_N$, each test vector for testing a respective scan chain set and comprising plural test bits $b_1, b_2, b_3, \ldots, b_m$;
   assembling corresponding test bits $b_i$ of each test vector $v_1, v_2, v_3, \ldots, v_N$ into plural N-bit input vectors $a_i$ such than $a_i = v_1[b_i], v_2[b_i], v_3[b_i], \ldots, v_N[b_i]$, where i=1 to m;
   synchronous with a first clock signal, consecutively serially inputting each N-bit input vector $a_i$ into an N-bit input register bank of the integrated circuit and shifting synchronous with a second clock signal each test bit of each input vector $a_i$ substantially simultaneously into a respective scan chain set.

8. The method of loading plural test vectors of claim 7, further comprising:
   performing scan based testing of the integrated circuit using the test vectors to obtain corresponding plural result vectors $r_1, r_2, r_3, \ldots, r_N$, wherein each result vector includes result bits $t_1, t_2, t_3, \ldots, t_m$;
   synchronous with the first clock signal, substantially simultaneously receiving a separate corresponding result bit $b_r$ from each scan chain set, each result bit being a bit from a respective result vector $r_1, r_2, r_3, \ldots, r_N$;
   synchronous with a second clock signal, serially outputting an N-bit vector from an output of the integrated circuit, the N-bit vector including corresponding result bits $b_i$ for each result vector; and
   processing plural consecutive output N-bit vectors to assemble corresponding result bits $t_i$ of each N-bit vector into the result vectors $r_1, r_2, r_3, \ldots, r_N$.

9. A method of testing an integrated circuit including a test circuit, the test circuit comprising plural (N) scan chain sets, the method comprising:
   serially inputting plural input vectors into an input of the integrated circuit during m input cycles;
   after each input cycle, substantially simultaneously causing a test bit to be shifted into each scan chain set, each test bit being attributable to a respective bit of the input vector;
   after input of m input vectors, enabling a test of the test circuit, said test causing each scan chain of a scan chain set to be loaded with a respective result vector, each result vector comprising plural result bits;
   substantially simultaneously shifting each result bit out of the test circuit during m output cycles, each output cycle causing an output register of the integrated circuit to be loaded with an N-bit vector comprising plural bits, each being attributable to a respective result bit; and
   after each output cycle, serially outputting an N-bit vector from an output of the integrated circuit, the N-bit vector including corresponding result bits $b_i$ for each result vector.

* * * * *

UNITED STATES PATENT AND TRADEMARK OFFICE
CERTIFICATE OF CORRECTION

| | | |
|---|---|---|
| PATENT NO. | : 8,458,543 B2 | Page 1 of 1 |
| APPLICATION NO. | : 12/968292 | |
| DATED | : June 4, 2013 | |
| INVENTOR(S) | : Mun Wai Tung | |

It is certified that error appears in the above-identified patent and that said Letters Patent is hereby corrected as shown below:

In the Claims:

Column 11, Line 33, please correct "vectors, such than" to be --vectors, such that--

Signed and Sealed this
First Day of April, 2014

Michelle K. Lee
*Deputy Director of the United States Patent and Trademark Office*